United States Patent
Chen et al.

(10) Patent No.: US 7,656,031 B2
(45) Date of Patent: Feb. 2, 2010

(54) STACKABLE SEMICONDUCTOR PACKAGE HAVING METAL PIN WITHIN THROUGH HOLE OF PACKAGE

(75) Inventors: Cheng-Chung Chen, Taipei (TW);
Chia-Chung Wang, Hsinchu (TW);
Chin Hock Tan, Singapore (SG);
Charles W. C. Lin, Taipei County (TW)

(73) Assignee: Bridge Semiconductor Corporation, Taipei (TW)

( * ) Notice: Subject to any disclaimer, the term of this patent is extended or adjusted under 35 U.S.C. 154(b) by 396 days.

(21) Appl. No.: 11/808,129

(22) Filed: Jun. 6, 2007

(65) Prior Publication Data
US 2008/0185708 A1    Aug. 7, 2008

Related U.S. Application Data

(60) Provisional application No. 60/899,573, filed on Feb. 5, 2007.

(51) Int. Cl.
*H01L 23/12* (2006.01)

(52) U.S. Cl. .................. 257/733; 257/690; 257/693; 257/698; 257/723; 257/E33.056; 257/E23.001

(58) Field of Classification Search ............... 257/690, 257/693, 698, 723, 733, E33.056, E23.001; 438/64, 106
See application file for complete search history.

(56) References Cited

U.S. PATENT DOCUMENTS

| | | | |
|---|---|---|---|
| 2006/0091542 A1* | 5/2006 | Zhao et al. | 257/738 |
| 2006/0252180 A1* | 11/2006 | Moden et al. | 438/106 |
| 2006/0259093 A1* | 11/2006 | Stevenson et al. | 607/37 |
| 2007/0290376 A1* | 12/2007 | Zhao et al. | 257/787 |
| 2008/0253085 A1* | 10/2008 | Soffer | 361/687 |

* cited by examiner

*Primary Examiner*—Thanh V Pham

(57) ABSTRACT

The present invention provides a stackable semiconductor having an interconnect board for providing electrical interconnections, the package includes a plurality of solders disposing onto the interconnect board; and a conducting metal pin passing through each solder and the interconnect board, the metal pins having at least one end disposes on the semiconductor package, wherein when a plurality of the stackable semiconductor packages are stacked together, the exposed end of the corresponding conducting pins are bonded together. A method of manufacturing the same is also provided.

7 Claims, 15 Drawing Sheets

STACKABLE SEMICONDUCTOR PACKAGE HAVING METAL PIN WITHIN THROUGH HOLE OF PACKAGE

This application claims benefit of 60/899,573 filed Feb. 5, 2007.

FIELD OF THE INVENTION

The present invention relates to a semiconductor package; more particularly, relates to a semiconductor package having a three-dimensional stacking capability and its method of manufacturing the same.

BACKGROUND

Portable electronic devices require higher functionality and capacities in a limited size at a lowest possible cost. This has driven the industry to increase integrations not only on the silicon level but also at the package level, that is, by stacking bare dies onto one package or stacking known good packages together to realize higher functionality and density.

The primary limitation to the stacked dies approach is the low final package yield as it is inevitable that some of the dies in the package may have low yield because of design complexity or processing related issues. If these low yield dies are included in the stacking configuration without pre-testing, the compound yield of the final package which is the product of the individual die test yields can be unacceptably low.

In addition, the need to pre-test or burn-in devices along with other technical requirements such as poor heat dissipation path and possible electromagnetic interference (EMI) make the stacked dies less attractive.

U.S. Pat. No. 6,577,013 entitled "Chip Size Semiconductor Packages with Stacked Dies", issued on Jun. 10, 2003, describes stacking of multiple dies to form a chip-size package. The dies are stacked on one another in such a way that terminal pads of each die are aligned so that through silicon via can pass through the terminal pads and these pads are interconnected through an electrically conductive wire or pin inserted in the vias.

In addition to the common problems associated with bare die stacking, the obvious drawback existed in the prior art is that this vertical connection approach only allows same dies to be stacked in a particular configuration. This because the conductive pin or wire must be inserted in the silicon via that penetrates through the terminal pads of the individual dies in order to provide the connection. In other words, if a different die is placed in the stack, its terminal pads may not be in the specified vertical path to be connected and thus may result in these terminal pads being isolated and not providing the designated functions. Furthermore, as most of the terminal pads on the die surface are relatively small, the effective dimension of the drilled silicon via needs to be sufficiently small to be put within the peripheral of the pad to avoid destroying the pad. The small silicon via hole dictates a thin and fragile pin to be inserted mechanically and this can be a serious problem as it is not practical for volume production due to its low throughput and manufacturing yield.

U.S. Pat. No. 6,908,785 entitled "Multi-Chip Package (MCP) with a Conductive Bar and Method for Manufacturing the Same" issued on Jun. 21, 2005 describes another bare die stacking architecture in which a plurality of pad re-distribution lines are deposited on the die surface in order to relocate the original terminal pads for the vertical connection.

Although this app roach provides a more flexible method in stacking and eases the strict restriction of vertical connection only through the origin a pads, the bare die stacking of this approach still suffers the drawback that vertical stacking has to be carried out within the die boundary. Furthermore, the relocated pads need to be in the area where there is no active circuitry underneath. This is to ensure that through silicon vias do not destroy the circuits and affect chip's proper function. This can not be practically possible unless these areas are designated and reserved in advance.

Integrating silicon density or functionality can be achieved by stacking finished packages to form a multi-package module. In this approach each die is assembled in a respective package first and then integrated together to maximize performance and minimize cost. This approach can provide numerous advantages as compared to stacked die packages.

For instance, before the packages are stacked, each package can be electrically test, and rejected unless it shows satisfactory performance. As a result, the final stacked multi-package module yields are maximized.

More efficient cooling can be provided in stacked packages by inserting a heat spreader between the packages in the stack as well as at the top of the module.

Package level stacking also allows electromagnetic shielding on the RF (radio frequency) dies and minimizes interference with other dies within the module.

However, stacking one package on top of another can be a challenge if the encapsulant that is deposited on the chip completely blocks off the vertical interconnecting channel. As such, in the package-on-package stacking configuration, enabling a z-axis connection to interconnect top and bottom packages is a critical technology from the viewpoints of manufacturability, design flexibility and cost. Many z-interconnect approaches for stacking have been proposed, including peripheral solder ball connection, and flexible substrate folded over the top of the bottom package, and so on.

The use of peripheral solder balls in a package-on-package configuration greatly limits the design flexibility, and results in a low yield and a large size package. The use of a flexible folding substrate in general provides a better design flexibility, but it suffers a less established manufacturing infrastructure for the folding process. Moreover, flexible folding requires a two metal layer flex substrate, which is a more expensive material. Furthermore, the folded flexible substrate approach is restricted to relatively low pin-count applications because of the limitations in routing of the circuitry in two metal layer substrates.

The limitations of the solder ball connection are described in further detail with reference to FIG. 6 and FIG. 7.

FIG. 6 is a diagrammatic cross sectional view of a conventional Ball Grid Array ("BGA") package. The BGA package 600 comprises a semiconductor chip 610 and an interconnect board 620. The semiconductor chip 610 has a plurality of input/output (I/O) pads 611 disposed at a first surface 610a of the semiconductor chip 610, which is provided with a plurality of integrated circuits (ICs). The interconnect board 620 is bonded to a second surface 610b of the semiconductor chip 610 by means of an adhesive 630, such as a die attach epoxy. The interconnect board 620 has a dielectric substrate 621. A circuit pattern 622 provided with wire bond finger 624 is formed on a first surface of the dielectric substrate 621. Another circuit pattern 623 provided with a plurality of conductive lands 625 is formed on a second surface of the dielectric substrate 621. Each of the circuit patterns 622,623 has a conductive material such as copper, and is connected together by way of plated through via 626. Solder masks 627,628 are patterned over the dielectric substrate 621 and the circuit patterns 622,623 separately with underlying metal exposed at bonding sites for providing electrical connections, for example the wire bond fingers 624 and conductive lands 625 for bonding the wires 640 and solder balls 670 respectively.

The I/O pad 611 of the semiconductor chip 610 is electrically connected to the wire bond finger 624 in the first surface of the interconnect board 620 by means of conductive wires 640. In order to protect the semiconductor chip 610 and the wire 640 from the external environment, the first surface of the interconnect board 620 is encapsulated by a resin encapsulant 650 to facilitate handling operation. After encapsulation, a plurality of solder balls 670 are reflowed to be fused onto conductive lands 625 on the circuit pattern 623 to provide interconnections to the circuit board FIG. 7 is a diagrammatic sectional view illustrating the structure of an example of a 2-stack package-on-package board 700, in which a z-interconnect between packages in a stacking format is obtained by way of solder balls 775.

In this stacked structure the bottom package is similar to that shown in FIG. 6, which has a plurality of conductive lands on the first surface of the dielectric substrate. These conductive lands are located at the periphery of the package and are not encapsulated by the molding compound. Another package (which is referred to as the "top" package) is stacked on the bottom package and is similar in structure to the bottom package, except that the solder balls in the top package are only arranged at the peripheral of the package.

The z-axis connection in the 2-stacked package-on-package is achieved by reflowing of the solder balls 775 to the conductive lands at the upper surface of the bottom package to effect z-axis interconnection without interfering with the encapsulation of the bottom BGA.

The above mentioned conventional stacked package has some problems in that the distance between the top and bottom packages must be at least the encapsulation height of the bottom package, which is typically in a range between 0.5 mm and 1.5 mm. Accordingly, the solder balls 775 must be of a sufficiently large diameter so that, when reflowed, they make good contact with the bonding pads of the bottom BGA; that is, the diameter of the solder ball 775 must be greater than the bottom package's encapsulation height. A larger ball diameter dictates a larger ball pitch that in turn limits the number of balls that can be fitted within the limited space.

The above mentioned conventional stacked package configuration forces the stacked package to be significantly larger than the dimension of a standard BGA due to the peripheral arrangement of the solder balls. It becomes a problem that it cannot be applied to a variety of miniature electronic appliances, such as memory modules, memory cards, cellular phones, notebooks and PDAs.

U.S. Pat. No. 6,716,038, entitled "Z-axis Connection of Multiple Substrates by Partial Insertion of Bulges of a Pin", issued on Apr. 6, 2004, describes a three dimensional circuit module using twisted pins to electrically connect multiple, spaced-apart circuit board. An obvious drawback exists in this prior art is that there is no metallurgical connection between the pin and the plated through hole, and the physical contacts are not reliable under various heat treatments during board assembly.

In view of the various development stages and limitations in currently available semiconductor chip assemblies, there is a need for a semiconductor chip assembly that is cost-effective, reliable, and provides a vertical connection with excellent mechanical and electrical properties, and makes advantageous use the particular connection joint technique best suited for a given application.

Hence, the prior arts do not fulfill all users' requests on actual use.

SUMMARY OF THE INVENTION

The main purpose of the present invention is to provide a semiconductor package with a through hole and an inserted metal pin that is suitable for used in a package-on-package module.

Another purpose of the present invention is to provide a convenient, cost-effective method for manufacturing the above mentioned semiconductor package.

To achieve the above purposes, the present invention is a stackable semiconductor package having an interconnect board for providing electrical interconnections with a plurality of solders disposed onto the interconnect board and a conducting pin passing through each solder and the interconnect board, where the conducting pins have at least one end disposed on the semiconductor package; a plurality of the semiconductor packages are stacked together; and the exposed end of the corresponding conducting pins are bonded together.

The present invention has a method of fabricating the above semiconductor package, comprising steps of: providing an interconnect board with circuit pattern formed thereon; dispensing a soldering material on the circuit pattern of the interconnect board; mechanically attaching a semiconductor chip to the interconnect board, where the chip includes first and second opposing surfaces and the first surface of the chip includes a I/O pad; forming a connection joint that electrically connects the circuit pattern and the pad; forming an encapsulation of the chip by molding process, where the molding compound includes a first surface that faces in a first direction and a second surface that faces in a second direction opposite to the first direction; where the molding compound covers the chip and extends vertically beyond the chip and the interconnect board in the first direction; and where the chip is embedded in the molding compound and extends vertically beyond the interconnect board in the first direction forming a through hole that penetrates through and removes a portion of the molding compound, the soldering material, and the interconnect board; and inserting a metal pin having the same or almost the same diameter into the through hole to mechanically contacts the exposed soldering material with the soldering material reflowed to form a connection joint that electrically connects the circuit pattern and the inserted metal pin.

Accordingly, a novel stackable semiconductor package having metal pins with in through hole of package is obtained.

BRIEF DESCRIPTION OF THE DRAWINGS

The present invention will be better understood from the following detailed descriptions of the preferred embodiments according to the present invention, taken in conjunction with the accompanying drawings, in which.

DESCRIPTIONS OF THE PREFERRED EMBODIMENTS

The following descriptions of the preferred embodiments are provided to understand the features and the structures of the present invention.

Figure 1A:
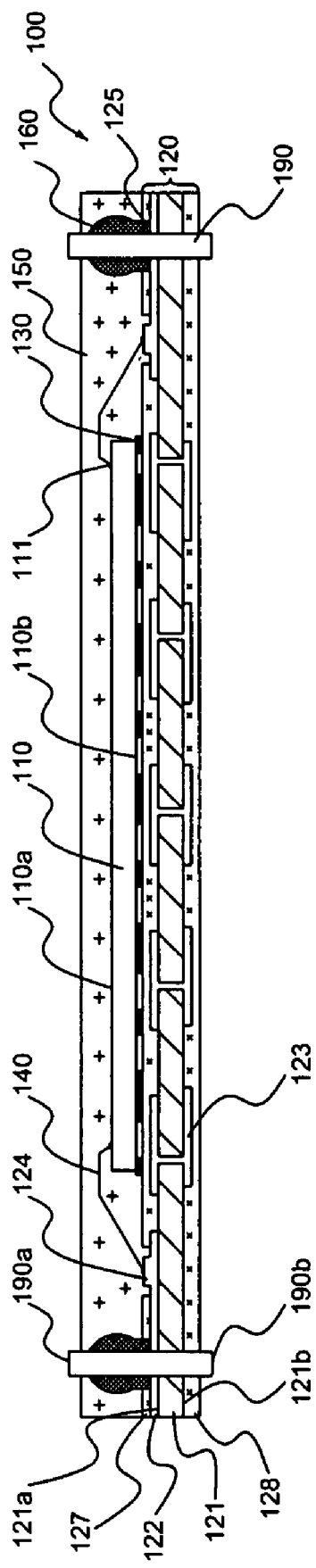
FIG. 1A is a sectional view showing a semiconductor package according to a first preferred embodiment of the present invention.

Please refer to FIG. 1A, which is a sectional view showing a semiconductor package according to a first preferred embodiment of the present invention. As shown in the figure, a stackable semiconductor package 100 has a plurality of metal pins inserted through the stackable semiconductor package 100, in which the metal pin is interconnected to a circuit pattern by a solder. The stackable semiconductor package 100 has a semiconductor chip 110 with a plurality of input/output (I/O) pads 111 at the first surface 110a of a semiconductor chip 110. An interconnect board 120 comprises a dielectric substrate 121, and circuit patterns 122,123 on each surfaces of the dielectric substrate 121. The interconnect board 120 is bonded to a second surface 110b of the semiconductor chip 110 by means of an adhesive 130 such as die attach epoxy.

Various substrates are used, including, for example, a laminate, a flexible polyimide tape, or a ceramic substrate. The circuit pattern 122 is provided with wire bond fingers 124; and a conductive land 125 is formed on a first surface 121a of the dielectric substrate 121. Another circuit pattern 123 is formed on the second surface 121b of the dielectric substrate 121. The conductive land 125 provides an underlying site for solder deposition. Solder masks 127,128 are patterned over the circuit patterns 122,123 separately to expose the underlying metal at bonding sites for electrical connections. The circuit pattern on a first surface of the interconnect board 120 extends laterally beyond the conductive land 125 towards the chip.

The interconnection between the semiconductor chip 110 and circuit pattern 122 is obtained by wire bond 140 between the I/O pads 111 of the semiconductor chip 110 and the wire bond fingers 124 on the first surface 121a of the dielectric substrate 121.

The semiconductor chip 110 and the wire bond 140 are encapsulated by a resin encapsulant 150 so that they are protected from external physical, chemical, or mechanical damages. The resin encapsulant 150 is formed in such a fashion that it completely encapsulates the entire first surface 121a of the dielectric substrate 121.

Figure 1B:
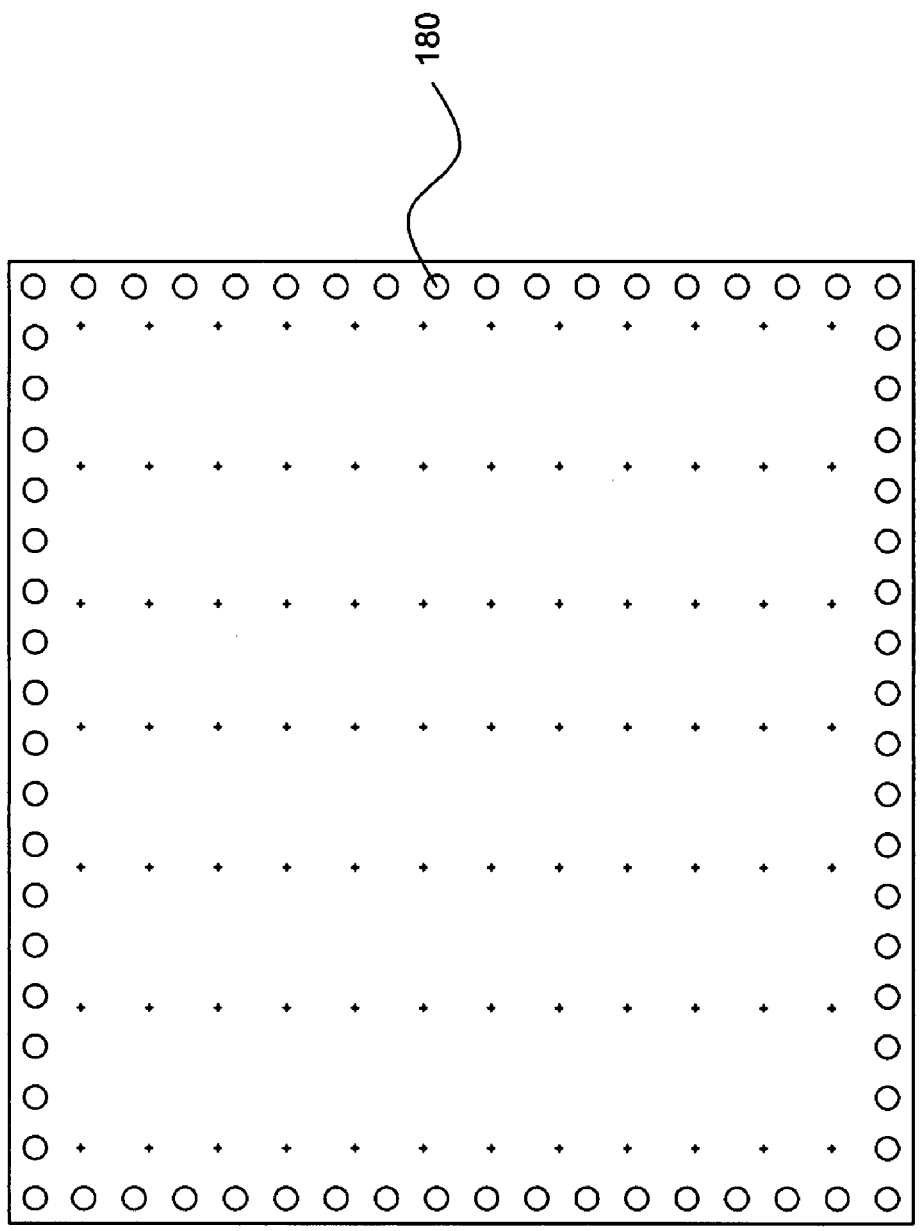
FIG. 1B is a top-down view showing through holes in margin of the semiconductor package according to the first preferred embodiment.

Please further refer to FIG. 1B, which is a top-down view showing through holes in margin of the semiconductor package. As shown in the figure, a plurality of through holes 180 in the margin of the package penetrate the resin encapsulant 150, the solder 160 and the interconnect board 120.

The through-holes 180 have a pitch as fine as 0.4 mm when using a 0.2 mm drill bit. Assuming the minimum clearance for a through hole to the die edge is 0.1 mm, dimensional enlargement for each side due to the through hole 180 is as small as 0.4 mm regardless of BGA molding thickness. With this approach, both the footprint and the thickness of the stacked package are greatly reduced and fall into acceptable ranges for most applications. This also enables a high number of metal pins to be placed in the molding compound and around the chip. Both manufacturability and design flexibility contribute to this feature.

A plurality of metal pins 190 are fitted to the through holes 180 and the through holes 180 are slightly smaller or almost the same diameter as the metal pins to provide good mechanical contact. The metal pin 190 is electrically connected to the conductive bond 160 (typically solder) mainly from the lateral direction; and the conductive bond 160 is electrically connected to the circuit pattern 122 from the first surface of the interconnect board 120. The conductive bond 160 provides an electrical continuity between the metal pins 190, the circuit pattern 122, the wire bond 140 and the I/O pads 111 of the semiconductor chip 110.

For example, the exposed conductive area of a 0.2 mm through hole which penetrates a sealed circuit pattern 122 with 18 μm in thickness is 3.14×200×18 μm square. This are a dictates the maximal contacting area between the metal pin 190 in the through hole 180 and the circuit pattern 122 and is normally too low for any reliable contacts that can possibly be accepted. By depositing solder (typically about 100 μm in height) on the circuit pattern before drilling the through hole 180, the electrical contacting area can be greatly increased up to 600% with in the through hole 180. This contacting area enlargement will not only lower contact resistance and enhance package reliability, but also provides a very fine pitch z-interconnect when stacking.

The metal pin 190 has two exposed ends with a terminal surface 190a orientated in the same direction as the first surface of the packages and other terminal surface 190b orientated in the same direction as the second surface of the package. The terminal surfaces 190a, 190b serve as the connecting means for upper and lower stacking separately.

The metal pin 190 provides the robustness for z-axis vertical interconnect as compared with solder balls which are generally used. In general, a metal pin serves as pre-formed column which has better rigidity compared with solder balls that may be 'deformed' after reflow.

Figure 2:
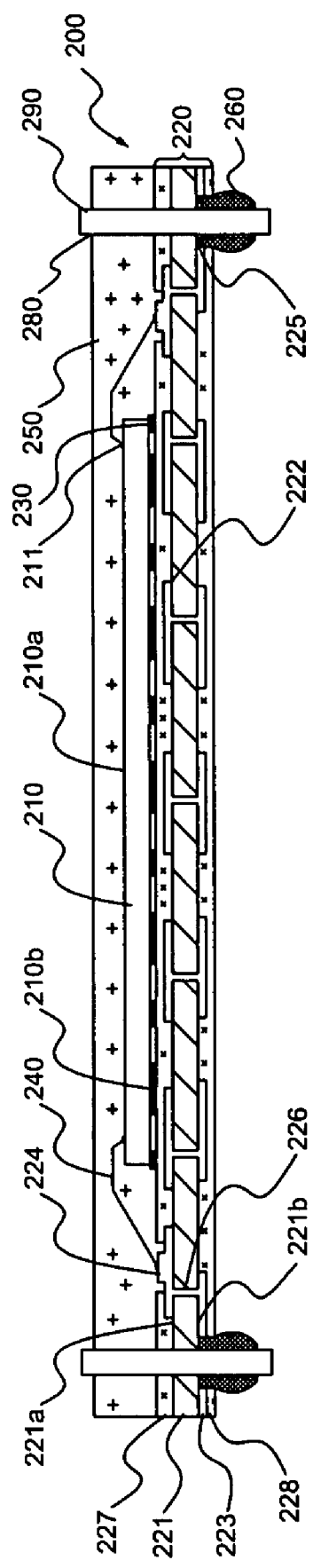
FIG. 2 is a sectional view showing a semiconductor package according to a second preferred embodiment of the present invention.

Please refer to FIG. 2, which is a sectional view showing a semiconductor package according to a second preferred embodiment of the present invention. As shown in the figure, conductive land and conductive bond of a semiconductor package 200 are not encapsulated by a resin encapsulant. The semiconductor package 200 has a semiconductor chip 210 with a plurality of I/O pads 211, which is provided with a plurality of integrated circuits (ICs). An interconnect board 220 is bonded to a second surface 210b of the semiconductor chip 210 by means of an adhesive 230, such as the die attach epoxy. The interconnect board 220 has a dielectric substrate 221. A circuit pattern 222 provided with wire bond fingers 224 is formed on the first surface 221a of the dielectric substrate 221. Another circuit pattern 223 and conductive land 225 is formed on the second surface 221b of the dielectric substrate 221. Solder masks 227,228 are patterned over the circuit patterns 222,223 separately with underlying metal exposed at bonding sites for electrical connections.

The interconnection between the semiconductor chip 210 and the circuit pattern 223 is obtained by wire bond 240 between the I/O pad 211 of the semiconductor chip 210, the wire bond finger 224 on the first surface 221a of the dielectric substrate 221, through holes 280, and another circuit pattern 223. The circuit pattern 223 on the second surface of the interconnect board extends laterally beyond the conductive land 225 towards the chip.

The semiconductor chip 210 and the wire bond 240 are encapsulated by a resin encapsulant 250. The resin encapsulant 250 is formed in such a fashion that it completely encapsulates the entire first surface 221a of the dielectric substrate 221.

A plurality of through holes 280 in the margin of the package penetrate the resin encapsulant 250, the interconnect board 220, the conductive land 225, and the conductive bond (typically solder) 260. A plurality of metal pins 290 are kept in position in the through holes 280 and has a slightly smaller or almost the same diameter as the through holes 280. The metal pin 290 is electrically connected to the conductive bond 260 mainly from the lateral direction; and the conductive bond 260 is electrically connected to the circuit pattern 223 from the second surface of the interconnect board 220. The conductive bond 260 provides the electrical continuity between the metal pin 290, the circuit pattern 223, plated though via 226, the circuit pattern 222, the wire bond 240 and I/O pad 211 of the semiconductor chip 210.

The exposure portions of the metal pin 290 that is locate at a first surface 200a of the package and a second surface 200b of the package serve as a portion of the terminals for upper and lower stacking.

Figure 3:
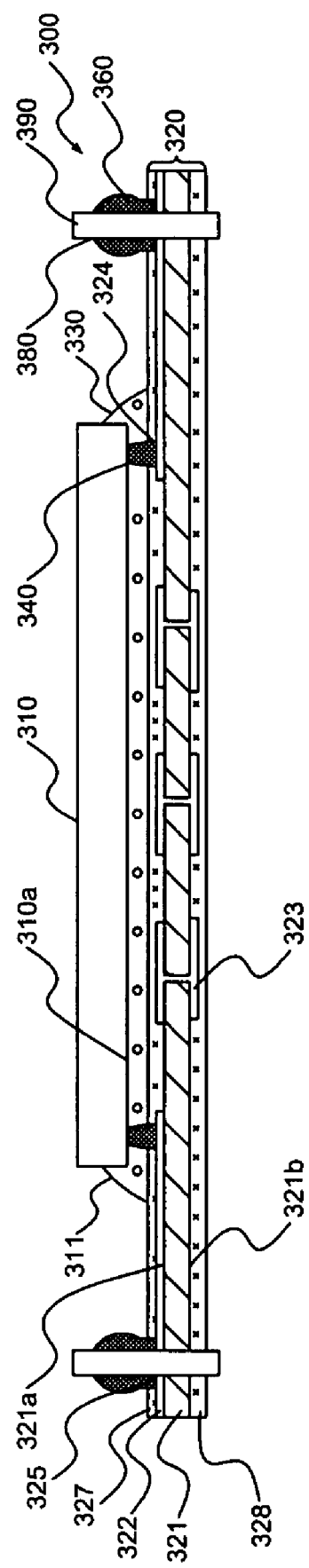
FIG. 3 is a sectional view showing a semiconductor package according to a third preferred embodiment of the present invention.

Please refer to FIG. 3, which is a sectional view showing a semiconductor package according to a third preferred embodiment of the present invention. As shown in the figure, a first surface and a second surface of the interconnect board of a semiconductor package 300 are not encapsulated by resin encapsulant and connecting means for the semi conductor package 300 is by flip chip.

The package 300 has a semiconductor chip 310 with a plurality of connecting bumps 340 on I/O pads 311, which is provided with a plurality of integrated circuits (ICs). An interconnect board 320 is bonded to a first surface 310a of the semiconductor chip 310 by means of an adhesive, typically referred to as an under-fill 330. Connecting bumps 340 are made of solder or gold.

The interconnect board 320 has a dielectric substrate 321. A circuit pattern 322 is provided with bond pad 324 formed on the first surface 321a of the dielectric substrate 321. Another circuit pattern 323 is formed on the second surface 321b of the dielectric substrate 321. Solder masks 327,328 are patterned over the circuit patterns 322,323 separately to expose the underlying metal at bonding sites for electrical connection.

The interconnection between the semiconductor chip 310 and the circuit pattern 322 is obtained by stud bond as connecting bumps 340 between the I/O pad 311 of the semiconductor chip 310, the bond pad 324 on the first surface 321a of the dielectric substrate 321 and the circuit pattern 322. The circuit pattern 322 on the first surface of the interconnect board extends laterally towards the chip.

A plurality of through holes 380 in the margin of the package penetrate the interconnect board 320, the conductive land 325, and the conductive bond 360 (typically solder). A plurality of metal pins 390 are kept in position in the through holes 380 and has the same or almost the same diameter as the through holes 380. The metal pin 390 is electrically connected to the conductive bond 360 mainly from the lateral direction; and the conductive bond 360 is electrically connected to the circuit pattern 323 from the second surface of the interconnect board 320. The conductive bond 360 provides the electrical continuity between the metal pin 390, the circuit pattern 323, the through hole, other circuit pattern 322, the stud bond (as connecting bumps 340 and the I/O pad 311 of the semiconductor chip 310.

The exposed ends of the metal pin 390 that locate at the first surface of the package and the second surface of the package serve as a portion of the terminals for upper and lower stacking respectively.

Figure 4:
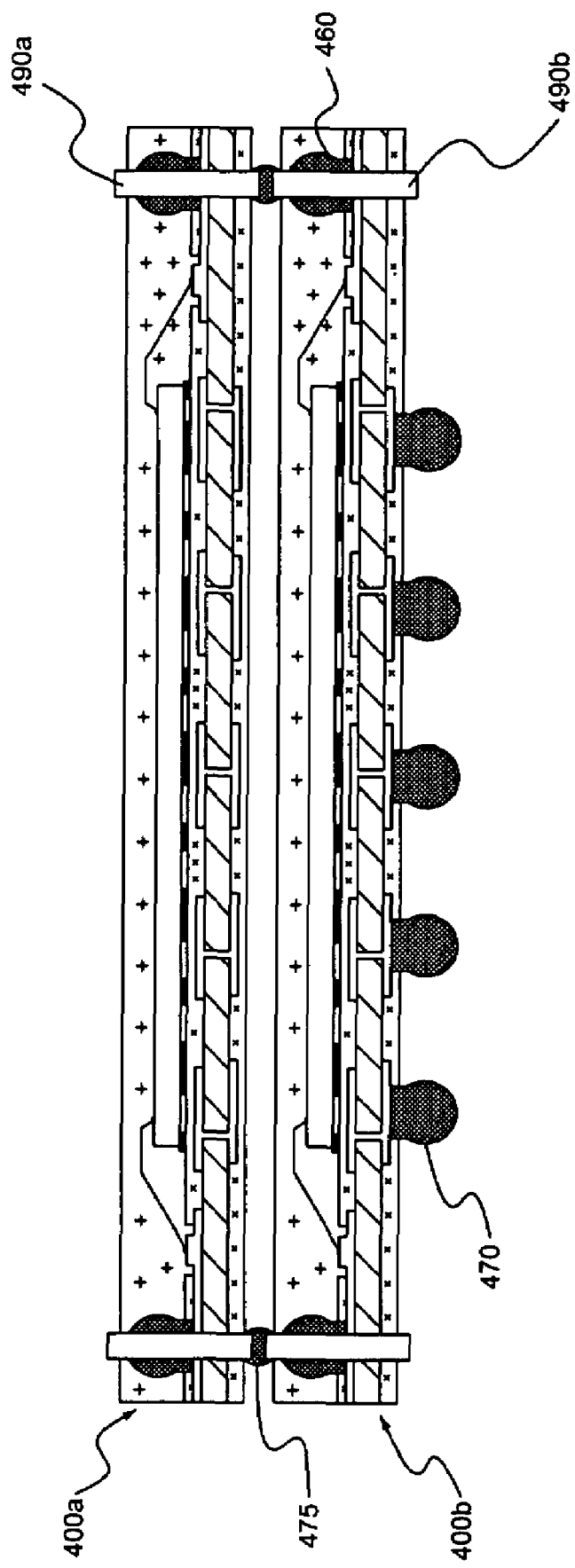
FIG. 4 is a sectional view showing a semiconductor package according to a fourth preferred embodiment of the present invention.

Please refer to FIG. 4, which is a sectional view showing a semiconductor package according to a fourth preferred embodiment of the present invention. As shown in the figure, an embodiment of two stacked semiconductor packages 400 comprises a top package 400a, having a plurality of top metal pins 490a, and a bottom package 400b, having a plurality of bottom metal pins 490b, where the plurality of top metal pins 490a are connected to the bottom package 400b; the plurality of bottom metal pins 490b are corresponding to the top metal pins 490a; the top and bottom metal pins 490a,490b are physically bonded to each other by solder 475. The bottom package 400b is provided with a plurality of solder balls 460 or conductive lands (land grid array).

The solder 475 is at first dispensed on one end of the metal pin 490b of the bottom package 400b and then aligned with the top metal pins 490a of the top package 400a. To facilitate physical and electrical connection between the two packages, the top metal pins 490a and bottom metal pins 490b are fused by solder reflow.

Please refer to FIG. 5A to FIG. 5H, which are sectional views showing stages in a semiconductor package fabricating method according to the present invention. As shown in the figures, the interconnect board 500 in FIG. 5A has a dielectric substrate 521, a circuit pattern 522 provided with wire bond finger 524, and a conductive land 525 formed on the first surface 321a of the dielectric substrate 521. Another circuit pattern 523 is formed on the second surface 321b of the dielectric substrate 521. Solder masks 527,528 are patterned over the circuit patterns 522,523 separately with underlying metal exposed at bonding sites for electrical connections.

Figure 5A:
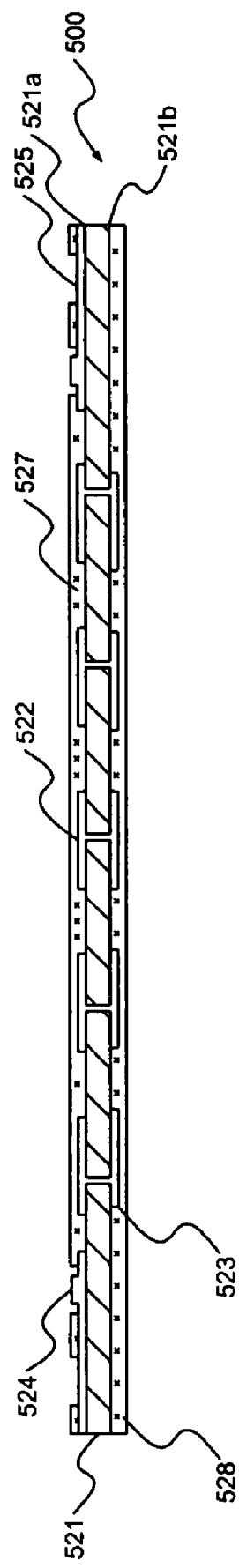
FIG. 5A to FIG. 5H are sectional views showing stages in a semiconductor package fabricating method according to the present invention.
Figure 5B:
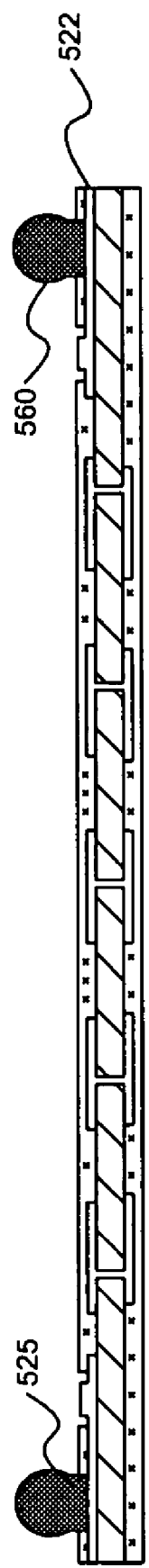

In FIG. 5B, a solder 560 is fused on the conductive land 525 of the circuit pattern 522. The solder 560 pre-deposited on the circuit pattern 522 is to allow solder to reflow at a later stage. The pre-deposited solder provides a friendly assembly process to facilitate an electrical contact between an inserted metal pin and a circuit pattern.

Figure 5C:
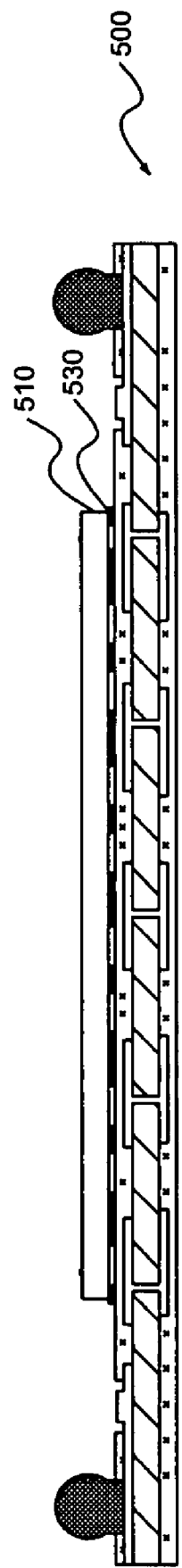

In FIG. 5C, a semiconductor chip 510 is bonded onto the interconnect board 500 by means of an adhesive 530.

Figure 5D:
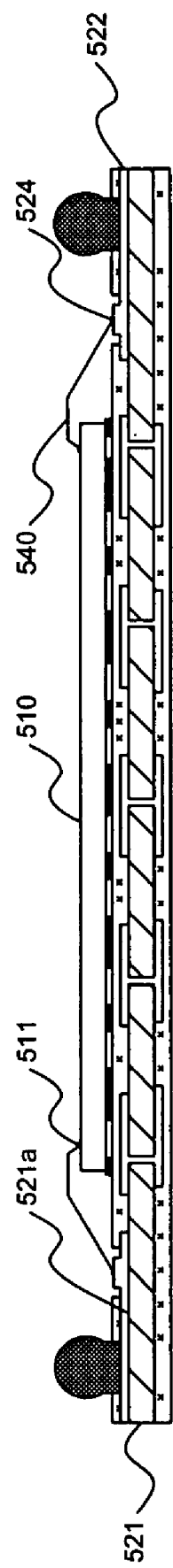

In FIG. 5D, interconnections between the semiconductor chip 510 and circuit patterns 522 are formed by wire bond 540 between I/O pads 511 of the semiconductor chip 510 and wire bond fingers 524 on the first surface 521a of the dielectric substrate 521.

Figure 5E:
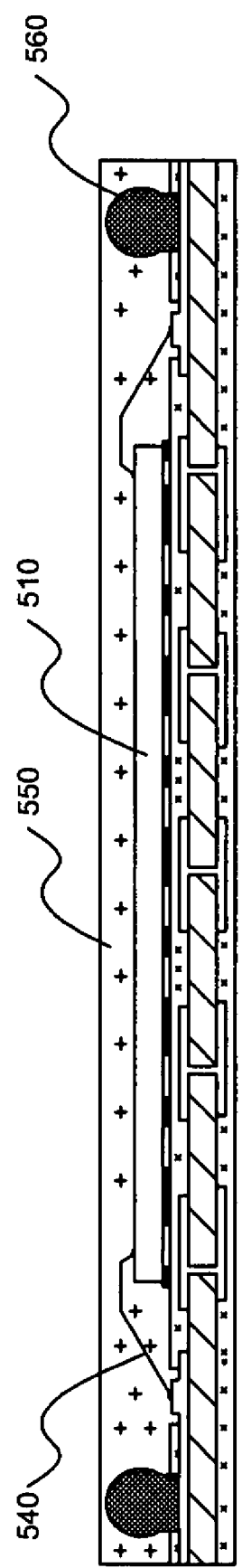

In FIG. 5E, the semiconductor chip 510, the wire bond 540 and the solder 560 are encapsulated by a resin encapsulant 550.

Figure 5F:
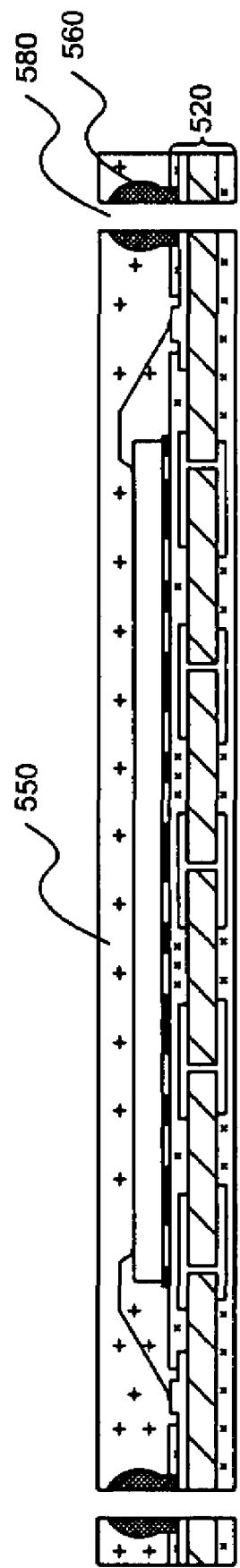

In FIG. 5F, a plurality of through holes 580 are formed along the margins of the package. These through holes 580 penetrate the resin encapsulant 550, the solder 560, and interconnect board 520.

Figure 5G:
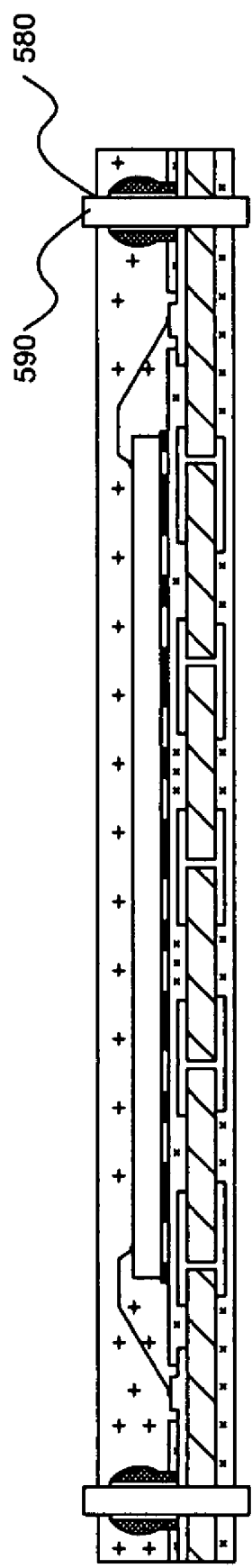

In FIG. 5G, a plurality of metal pins 590, which are slightly smaller or has almost the same diameter as the through holes, are inserted into the through holes 580 separately.

Figure 5H:
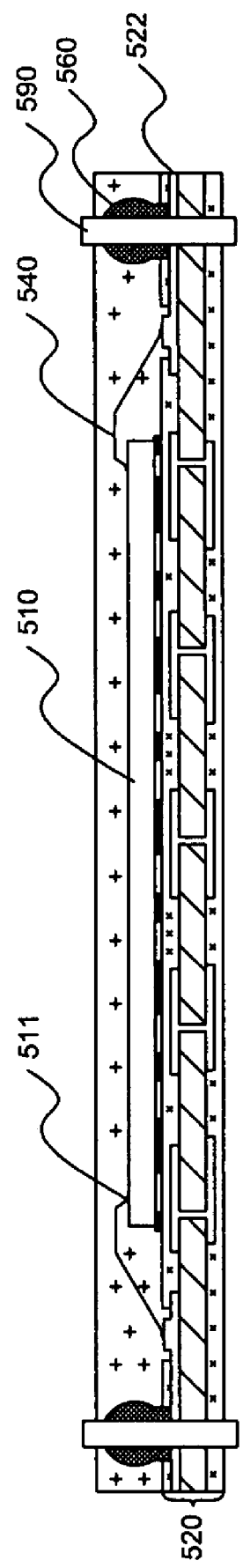
Figure 6:
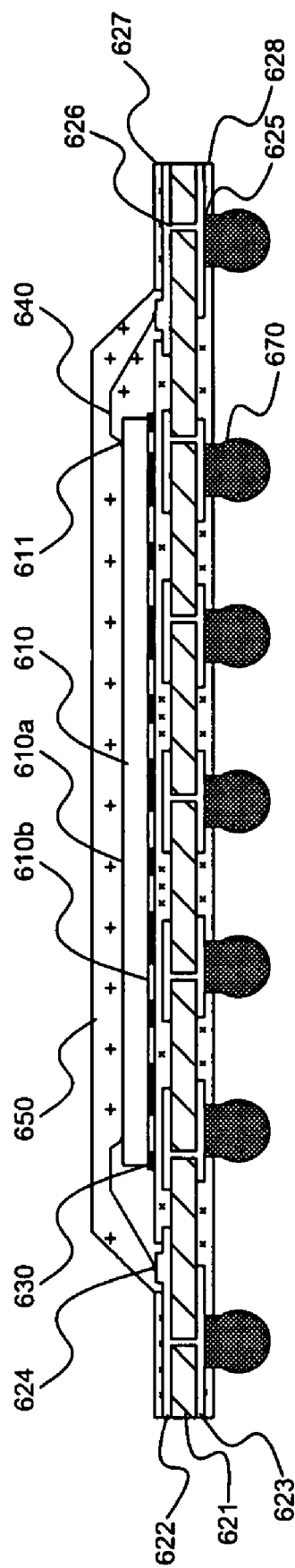
FIG. 6 is a sectional view of a conventional ball grid array semiconductor package.
Figure 7:
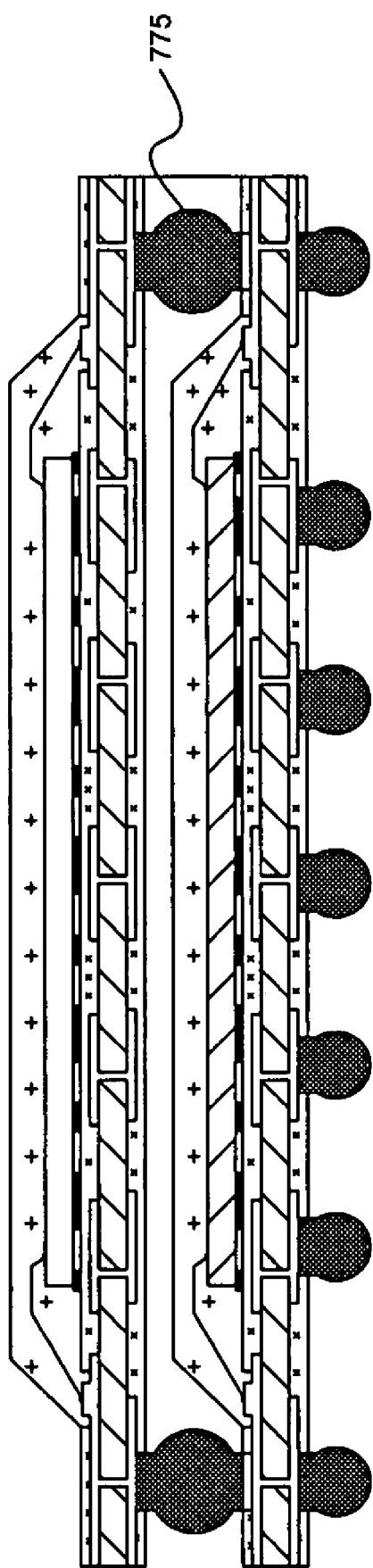
FIG. 7 is a sectional view of a conventional multi-package module having solder balls as a z-interconnection between stacked ball grid array semiconductor packages.

In FIG. 5H, the metal pins 590 are locked and kept in position after solder reflow, where the solder 560 is physically fused to the metal pins 590 and electrically connected to the circuit pattern 522 from the first surface of the interconnect board 520. The solder 560 as a conductive bond provides electrical continuity between the metal pin 590, the circuit pattern 522, the wire bonds 540 and the I/O pads 511 of the semiconductor chip 510.

Further steps for fabricating the stackable semiconductor package include testing and singulation of the completed package from the strip, for example, by saw singulation or by punch singulation; and packaging for further use.

An advantage of the present invention is that the semiconductor package can be manufactured conveniently and cost effectively.

Advantageously, the packages can be tested prior to be stacked, and packages that do not meet requirements for performance or reliability can be discarded, so that preferably only packages tested as "good" will be used in the assembled module to maximize the final assembly yield.

Another advantage is that the present invention adopts the well-established holes drilling and metal pin insertion processes in printed circuit board (PCB) and connector industries; and thus the present invention can be the technique having the lowest cost possible for multi-package stacking that is directly applicable to the semiconductor packaging industry without significant modification.

Another advantage is that the metal pin is a single piece, thereby ensures a robust mechanical strength, uniformity, and electrical connection for the z-axis.

Yet another advantage is that a contacting area between an inserted metal pin and a circuit pattern is greatly enhanced by a large contact volume of solder exposed in a through hole, thereby ensures a reliable connection joint from the lateral direction.

Another advantage is that the package need not include wet chemical plating in the through holes that is tedious, difficult to control, and not reliable especially when the resin encapsulant includes filler.

Another advantage is that the package need not include solder paste filling or conductive adhesive filling of the through hole, although the process is flexible enough to accommodate these techniques if desired.

Yet another advantage is that a plurality of metal pins surrounding the chip can provide an electrical shield to limit an electromagnetic interference between an RF chip and other chips in the neighborhood. In some cases, such electrical shield configuration may additionally be configured to serve as a heat spreader.

Still another advantage is that the package can accommodate various types of interconnect board, including conventional laminate, build-up, flexible or ceramic substrate. The board can have a single routing layer or multi routing layer providing that the z-interconnect pads are made available for connecting of the inserted metal pin to the designated circuitry.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A stackable semiconductor package having metal pin within through holes of package, comprising:
    an interconnect board having a dielectric substrate with a first surface and an opposite second surface;
    a plurality of electrically conductive circuit patterns on each of said first surface and said second surface of said dielectric substrate,
        wherein said circuit patterns have a plurality of bond fingers, and more than one of said circuit patterns of said first surface of said dielectric substrate are electrically connected through plated through via to more than one of said circuit patterns of said second surface of said dielectric substrate;
    a semiconductor chip having a plurality of input/output (I/O) pad at said first surface and said opposite second surface;
    a plurality of conductive connecting means, wherein each of said conductive connecting means is electrically connected between an I/O pad of said semiconductor chip and a respective bond finger of said circuit patterns of a surface of said dielectric substrate;
    a resin encapsulant having first surface and second opposing surface,
        wherein said first surface of said resin encapsulant have a first direction, said second surface of said resin encapsulant have a second direction opposite to said first direction, said semiconductor chip is embedded in said resin encapsulant and said resin encapsulant covers and extends vertically beyond said semiconductor chip in said first direction;
    a plurality of through holes being disposed outside a periphery of said semiconductor chip and being extended vertically across all of a thickness of said stackable semiconductor package between said first surface of said resin encapsulant and said second surface of said interconnect board;
    a plurality of metal pins being inserted in said through holes, being unbent in said first direction and said second direction, extending vertically across a first surface and a second surface of said through hole, and having two exposed ends to serve as connecting means for upper and lower stacking; and
    a plurality of conductive bonds contacting said metal pins and said circuit patterns, and providing electrical continuity between said metal pins and said circuit patterns.

2. The stackable semiconductor package according to claim 1,
    wherein said conductive bond contacts said circuit pattern from said first surface of said interconnect board.

3. The stackable semiconductor package according to claim 1,
    wherein said conductive bond contacts said circuit pattern from said second surface of said interconnect board.

4. The stackable semiconductor package according to claim 1,
    wherein said conductive bonds contact said circuit patterns from both surfaces of said interconnect board.

5. The stackable semiconductor package according to claim 1,
    wherein said conductive bond is made of solder.

6. The stackable semiconductor package according to claim 1
    wherein said conductive bond is made of conductive adhesive.

7. A stackable semiconductor package having metal pins within through holes of package, comprising:
    an interconnect board having a dielectric substrate with a first surface and an opposite second surface;
    a plurality of electrically conductive circuit patterns on each of said first surface and said second surface of said dielectric substrate,
        wherein said circuit patterns have a plurality of bond fingers, and more than one of said circuit patterns of said first surface of said dielectric substrate are electrically connected through said plated through via to more than one of said circuit patterns of said second surface of said dielectric substrate;

a semiconductor chip having a plurality of I/O pad at said first surface and said opposite second surface;

a plurality of conductive connecting means, wherein each of said conductive connecting means is electrically connected between an I/O pad of said semiconductor chip and a respective bond finger of said circuit patterns of a surface of said dielectric substrate;

a plurality of through holes being disposed outside a periphery of said semiconductor chip and being extended vertically across all of a thickness of said interconnect board between said first surface and said second surface of said interconnect board;

a plurality of metal pins being inserted in said through holes, being unbent in said first and second directions, extending vertically beyond said first surface and said second surface of said semiconductor chip and said second surface of said interconnect board, and having two exposed ends to serve as connecting means for upper and lower stacking, and a plurality of conductive bonds on said circuit patterns contacting said metal pins, and providing electrical continuity between said metal pins and said circuit patterns.

* * * * *